United States Patent
Akiyama

(10) Patent No.: US 9,806,152 B2
(45) Date of Patent: Oct. 31, 2017

(54) VERTICAL INSULATED GATE TURN-OFF THYRISTOR WITH INTERMEDIATE P+ LAYER IN P-BASE

(71) Applicant: Pakal Technologies, LLC, San Francisco, CA (US)

(72) Inventor: Hidenori Akiyama, Miyagi (JP)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 15/448,530

(22) Filed: Mar. 2, 2017

(65) Prior Publication Data

US 2017/0256614 A1     Sep. 7, 2017

Related U.S. Application Data

(60) Provisional application No. 62/303,761, filed on Mar. 4, 2016.

(51) Int. Cl.
| | | |
|---|---|---|
| H01L 29/00 | (2006.01) | |
| H01L 29/10 | (2006.01) | |
| H01L 29/745 | (2006.01) | |
| H01L 29/423 | (2006.01) | |
| H01L 29/74 | (2006.01) | |
| H01L 29/744 | (2006.01) | |
| H01L 29/66 | (2006.01) | |
| H01L 29/78 | (2006.01) | |

(52) U.S. Cl.
CPC ........ *H01L 29/102* (2013.01); *H01L 29/4236* (2013.01); *H01L 29/66734* (2013.01); *H01L 29/742* (2013.01); *H01L 29/744* (2013.01); *H01L 29/745* (2013.01); *H01L 29/7455* (2013.01); *H01L 29/7827* (2013.01); *H01L 2924/1301* (2013.01); *H01L 2924/1302* (2013.01); *H01L 2924/13021* (2013.01); *H01L 2924/13022* (2013.01)

(58) Field of Classification Search
CPC ......... H01L 2924/1301; H01L 29/4236; H01L 29/66734; H01L 2924/1302; H01L 2924/13021; H01L 2924/13022; H01L 29/744; H01L 29/745
See application file for complete search history.

(56) References Cited

U.S. PATENT DOCUMENTS

| | | | | |
|---|---|---|---|---|
| 2013/0105845 | A1* | 5/2013 | Kim | .............. H01L 27/156 257/98 |
| 2017/0141216 | A1* | 5/2017 | Abe | ............... H01L 29/7397 |
| 2017/0148893 | A1* | 5/2017 | Baburske | ......... H01L 29/66348 |

* cited by examiner

*Primary Examiner* — Ngan Ngo
(74) *Attorney, Agent, or Firm* — Patent Law Group LLP; Brian D Ogonowsky

(57) ABSTRACT

An insulated gate turn-off thyristor has a layered structure including a p+ layer (e.g., a substrate), an n-epi layer, a p-well, vertical insulated gate regions formed in the p-well, and an n-layer over the p-well and between the gate regions, so that vertical npn and pnp transistors are formed. The p-well has an intermediate highly doped portion. When the gate regions are sufficiently biased, an inversion layer surrounds the gate regions, causing the effective base of the npn transistor to be narrowed to increase its beta. When the product of the betas exceeds one, controlled latch-up of the thyristor is initiated. The p-well's highly doped intermediate region enables improvement in the npn transistor efficiency as well as enabling more independent control over the characteristics of the n-type layer (emitter), the emitter-base junction characteristics, and the overall dopant concentration and thickness of the p-type base.

15 Claims, 4 Drawing Sheets

VERTICAL INSULATED GATE TURN-OFF THYRISTOR WITH INTERMEDIATE P+ LAYER IN P-BASE

CROSS-REFERENCE TO RELATED APPLICATIONS

This application claims priority from provisional application Ser. No. 62/303,761, filed Mar. 4, 2016, by Hidenori Akiyama.

FIELD OF THE INVENTION

This invention relates to insulated gate turn-off thyristors and, in particular, to a vertical IGTO thyristor that includes a special p-dopant profile in its npn transistor base to improve operating characteristics.

BACKGROUND

FIG. 1 is a cross-sectional view of a portion of a prior art insulated gate turn-off (IGTO) thyristor 10 described in the inventor's U.S. Pat. Nos. 7,705,368 and 9,306,598, incorporated herein by reference. An npnp semiconductor layered structure is formed. A pnp transistor is formed by a p+ substrate 12 (emitter), an n-epitaxial (epi) layer 14 (base), and a p– well 16 (collector). The p-well 16 is typically formed using implantation and drive-in. There is also an npn transistor formed by the n-epi layer 14 (collector), the p-well 16 (base), and an n+ layer 18 (emitter). A bottom anode electrode 20 contacts the substrate 12, and a top cathode electrode 22 contacts the n+ layer 18. Trenches 24, coated with an oxide layer 25, contain a conductive gate 26 (forming interconnected vertical gate regions) which is contacted by a gate electrode 28. The p-well 16 surrounds the gate structure and, outside the drawing, the n– epi layer 14 extends to the surface around the p-well 16 near a termination area.

When the anode electrode 20 is forward biased with respect to the cathode electrode 22, but without a sufficiently positive gate bias, there is no current flow, since there is a reverse biased pn junction and the product of the betas (gains) of the pnp and npn transistors is less than one.

When there is a sufficient positive voltage applied to the gate 26, and there is a forward anode-cathode voltage, electrons from the n+ layer 18 become the majority carriers along the trench sidewalls and below the bottom of the trenches 24 in an inversion layer. This inversion layer forms a voltage-induced emitter, resulting in the effective width of the npn base (the portion of the p-well 16 below the trenches 24) to be reduced. As a result, the beta of the npn transistor increases to cause the product of the betas to exceed one. This condition results in "breakover," when holes are injected into the lightly doped n-epi layer 14 and electrons are injected into the p-well 16 to fully turn on the thyristor. This behavior results in the controlled latch-up of the device involving regenerative action. Accordingly, the gate bias initiates the turn-on, and the full turn on is accomplished by the current flow through the npn and pnp transistors.

The voltage applied to the gate needed to turn on the device is called the gate turn on, or threshold, voltage Vt. A typical threshold voltage Vt may be around 5 volts.

When the gate bias is made zero or negative volts, the thyristor turns off.

Although not described in U.S. Pat. No. 7,705,368, the identical gate and cathode structure shown in FIG. 1 may be repeated as an array (or matrix) of cells across the thyristor, and the various components may be connected in parallel so each cell conducts a small portion of the total current.

Such IGTO thyristors have a relatively high current density when on. In contrast, insulated gate bipolar transistors (IGBTs) generally have a lower current density when on. Accordingly, for at least high current applications, IGTO thyristors are preferred.

When the device is on, typically a zero or negative voltage can be applied to the gate to turn it off (assuming the anode and cathode are still forward biased). If the anode-cathode voltage differential is above a certain value, the device cannot be turned off by the gate. This value is called the maximum turn off voltage, and is specified at a particular current, such as 20A. The device can be damaged if the maximum turn off voltage is exceeded. The maximum turn off voltage is usually specified by the manufacturer.

Additionally, even when there is no gate turn on voltage, free electrons under a high anode-cathode voltage can undesirably turn the device on. The maximum forward voltage that can be applied to the device prior to switching without a gate turn on voltage is called the forward breakover voltage. It is desirable that this breakover voltage be high, such as equal to the breakdown voltage. Exceeding the breakover voltage may damage the device.

What is needed is an improvement of the general type of IGTO thyristor shown in FIG. 1, where the gate turn on voltage and other IGTO thyristor parameters can be adjusted independently, while not adversely affecting the maximum turn off voltage or decreasing the breakover voltage. Ideally, the safe operating area (SOA) is improved, where the SOA is defined as the voltage and current conditions over which the device can be expected to operate without self-damage.

SUMMARY

Assuming a vertical IGTO thyristor has a p-type base (a p-well) in which the gate trenches are formed and terminate, the p-type base (for the npn transistor) is doped to have a lightly doped upper p portion below an n-type layer (the npn transistor emitter), a more heavily doped intermediate p+ portion below the upper p portion, and a lightly doped lower p portion below the p+ portion. The bottoms of the gates are within the lower p portion. The dopant profile of the p-type base may be selected by ion implantation of p-type dopants into the silicon. The p-type base area is doped using a first implant and driven in, followed by a second implant and drive-in to form the intermediate p+ portion. The intermediate p+ portion should have a p-dopant concentration at least 1.5 times higher than that of the upper p portion. An upper limit to the p+ dopant concentration may be 10 times that of the upper p portion.

After the silicon is doped to form the p-type base, n-type dopants are implanted in the lightly doped upper p portion to convert the upper p portion to the n-type layer (emitter). The n-type layer comprises a medium-doped n-type layer and a top highly doped n+ type layer (emitter contact) for ohmic contact to the top cathode metal.

A high breakdown voltage of the device is achieved since the p+ portion does not deplete as much as a more lightly doped p base during an off state. So the dopant concentration of the upper and lower p portions can be reduced (compared with the prior art device) without lowering the breakdown voltage.

By lowering the dopant concentration of the upper p portion, the implanted n-type layer (emitter) can be formed with fewer implanted n-type dopants to convert the layer from p-type to n-type. The lighter doping of the upper p portion enables the n-type dopant concentration near the pn junction to be lower than that of the conventional IGTO thrystor. Further, the n+ type top layer can be more highly doped to provide better ohmic contact and lower contact resistance to the cathode metal.

Additionally, electron injection efficiency from the n-type emitter into the upper p portion is improved due to the lower dopant concentration of the upper p portion. The net n-type dopant concentration in the emitter can easily be made higher than the net p-type dopant concentration near the pn junction to improve efficiency. Further, by enabling the use of a more lightly doped n-type emitter, the device can have a higher maximum turn off voltage and a higher breakover voltage.

As a result of the improved electron injection efficiency and lower contact resistance, the gate threshold voltage Vt is lowered, such as below one volt. Switching losses are not adversely affected by the dopant profile assuming the same carrier lifetime.

Further, as a result the increased peak dopant level near the middle of the p-type base of the npn transistor, its off-state beta can be reduced, which further increases breakover voltage. Ideally, the breakover voltage is designed to be equal to the breakdown voltage.

By only increasing the dopant concentration of the p-type base in the middle of the p-type base and allowing the upper p portion to be lightly doped, there is independent control over the characteristics of the n-type layer (emitter), the emitter-base junction characteristics, and the overall dopant concentration in the p-type base, enabling better optimization of the depths and concentrations of the various layers.

When a threshold voltage is applied to the gate, the inversion of the p-type base around the gate effectively bypasses the p+ portion by extending the npn transistor emitter to below the gate, so the p+ portion only lowers beta gain of the npn transistor when there is no inversion of the base.

As a further improvement, the top n+ layer (emitter contact) may be etched to form a trench in the n+ layer to reduce the emitter contact thickness. A subsequent n-dopant implant may then be performed to increase the dopant concentration at the bottom of the trench. The cathode metal is then deposited in the trench to ohmically contact the highly doped bottom of the trench along with the sides of the etched trench. This improved electrical contact further lowers the gate threshold voltage.

The two techniques can be used independently or in conjunction to adjust the gate turn on voltage and increase the breakover voltage, without decreasing the maximum turn off voltage. Thus, SOA is not adversely affected.

Other embodiments are described.

BRIEF DESCRIPTION OF THE DRAWINGS

Elements that may be similar or equivalent in the various figures are labeled with the same numeral.

DETAILED DESCRIPTION

Various prior art fabrication details of a vertical IGTO thyristor may be found in the present inventor's U.S. Pat. No. 9,306,598, incorporated herein by reference. Such details may be used to form the prior art portions of the structures described herein.

Figure 1:
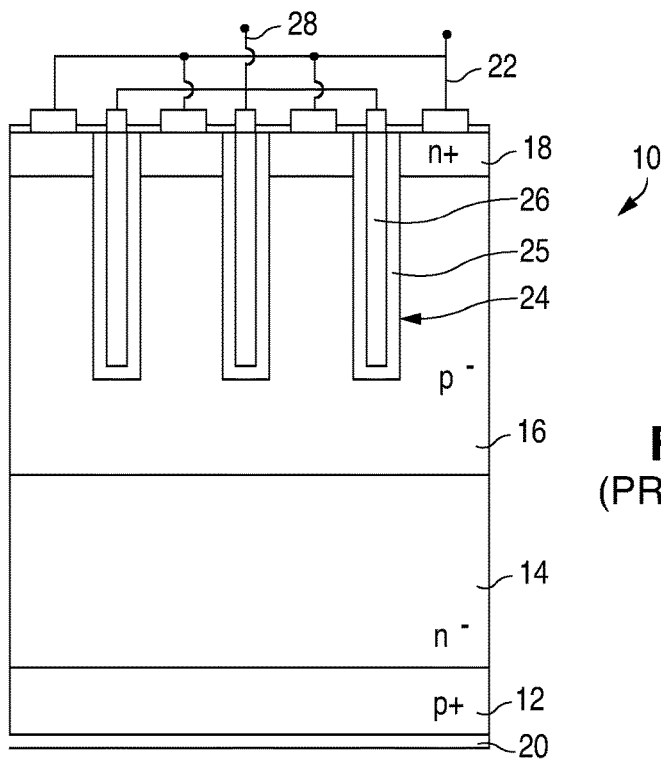
FIG. 1 is a cross-sectional view of the present inventor's prior art insulated gate turn off (IGTO) thyristor.
Figure 2:
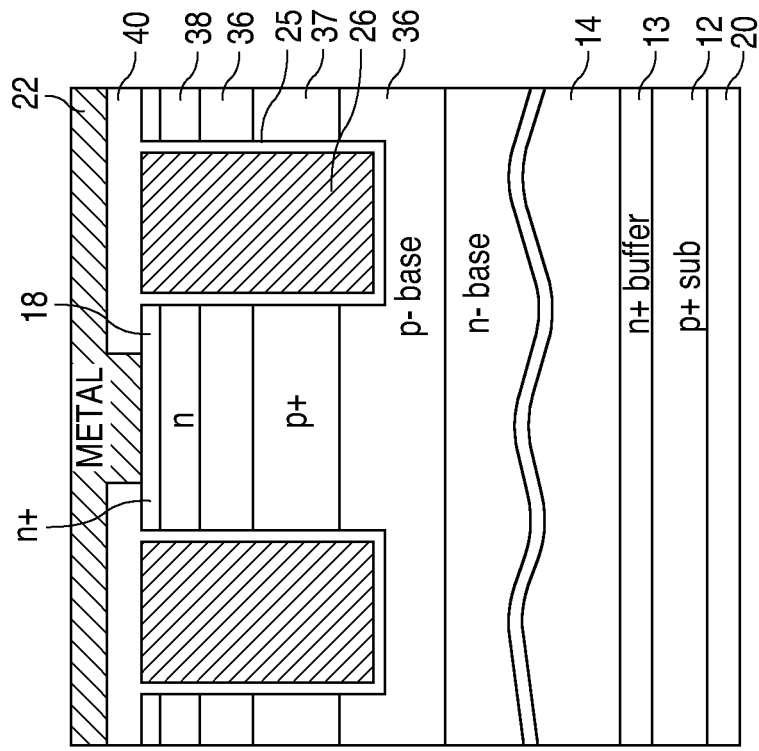
FIG. 2 is a cross-sectional view of a portion of an improved IGTO thyristor having an added p+ portion only in the middle region of the npn transistor base, enabling the formation of a more efficient emitter-base junction and other improved features to reduce the turn on voltage and increase the breakover voltage, without adversely affecting other operating characteristics.

FIG. 2 illustrates one embodiment of the inventive IGTO thyristor. Elements that are the same or equivalent to those elements in FIG. 1 are labeled with the same numerals. Only a brief summary of the basic operation of the prior art portion is presented below to limit redundancy.

In operation, the cathode electrode 22 may be connected to ground, and a load (e.g., a motor) is connected between the anode electrode 20 and a positive voltage supply terminal. Alternatively, the anode electrode 20 is connected to a positive voltage supply terminal, and the load is connected between the cathode electrode 22 and ground.

Basically, when a forward voltage is applied between the anode metal 20 and the cathode metal 22, and when the gate 26 voltage is below the threshold voltage, a pn junction in the device is reverse biased and no current is conducted. The gates 26 are all connected to a metal gate electrode outside the view of FIG. 2. The various layers form a vertical npn transistor and a vertical pnp transistor. When the product of the betas of the npn and pnp transistors is less than one, there is no regenerative action and no current is conducted. Any free electrons do not initiate the thyristor action.

When the gate voltage is above the threshold voltage Vt, the area of the p-type silicon around the trenched gate 26 is inverted to effectively extend the n-type emitter of the npn transistor down below the trenched gate 26. This change narrows the effective width of the p-type base of the npn transistor and increases its beta so that the product of the betas of the npn and pnp transistors is greater than one. Due to the inversion, electron-hole pairs are created which creates an initial current flow, which, in turn, creates various voltage drops across the layers to forward bias both the npn and pnp transistors. This behavior creates a much larger current, which turns on the transistors even more, called regenerative action.

When the gate 26 has a zero or negative voltage applied to it, the base width of the npn transistor is again widened to reduce the beta of the npn transistor, so the product of the betas is less than one. Thus, regenerative action stops, and the device is turned off.

Details of the device will now be presented along with the function of the novel doping profile of the p-type base of the npn transistor, which enables the device to have a lower threshold voltage while increasing the breakover voltage, without adversely affecting the maximum turn off voltage and switching losses. The various doped areas may be referred as layers since the device forms a vertically layered structure in the active area.

The starting p+ substrate 12 may have a dopant concentration of $1\times10^{18}$ to $2\times10^{19}$ cm$^{-3}$.

An n-type buffer layer 13 is then grown to a thickness of 3-10 microns thick and has a dopant concentration between about $10^{17}$ to $5\times10^{17}$ cm$^{-3}$.

An n− epi layer 14 is grown to a thickness of 40-70 microns (for a 600V device) and has a doping concentration between about $5\times10^{13}$ to $5\times10^{14}$ cm$^{-3}$. This dopant concentration can be obtained by in situ doping during epi growth. The n− epi layer 14 will be the base of the pnp transistor. The n-type buffer layer 13 reduces the injection of holes into the n− epi layer 14 from the p+ substrate 12 when the thyristor is off.

The p-well 36 is then formed by masking and boron dopant implantation into the n-epi layer 14, followed by a drive-in. The peak doping in the p-well 36 can be, for example, $10^{15}$-$10^{18}$ cm$^{-3}$. The depth of the p-well 36 depends on the maximum voltage of the device and may be between 0.5-10 microns. At this point in the process, the upper portion of the silicon is p-type due to the diffusion of the implanted p-type dopants. The p-type dopant density in the upper portion of the p-well 36 will be less than that of the prior art IGTO thyristor.

To form the intermediate p+ portion 37, p-type dopants are implanted, using a high energy implant, into the p-well 36 to a concentration of, for example, $10^{16}$-$10^{19}$ cm$^{-3}$, which is greater than the p-well 36 concentration. The thickness of the p+ portion 37 is not critical. The peak p-type dopant concentration in the p+ portion 37 is at least 1.5 as much as the peak concentration in the portions of the p-well 36 above and below the p+ portion 37 and may be up to 10 times as much. A preferred range of the ratio of the p+ portion 37 dopant concentration to the upper p-well 36 concentration is about 1.5-5. However, increasing the p-type dopant density above a certain limit will ultimately result in a lowering of the threshold voltage. Importantly, the p+ portion 37 increases the overall dopant concentration in the p-type base while allowing a decreased (compared to the prior art) dopant concentration in the upper portion of the p-well 36. The required thickness of the overall p-type base (for setting the breakdown voltage) may be controlled using the p+ portion 37.

An n-type layer 38 (an emitter) above the p-well 36 is then formed by ion implantation of n-type dopants, which converts the upper portion of the silicon from p-type to n-type. The net concentration of the n-dopants (exceeding the p-type dopants) can be, for example, $10^{15}$-$10^{18}$ cm$^{-3}$. By lowering the dopant concentration of the upper p-well 36 portion, the implanted n-type layer (emitter) can be formed with fewer implanted n-type dopants (a lower implant dose) to convert the layer from p-type to n-type.

Due to the more lightly doped upper p-well 36, the net n-type dopant concentration in the emitter can easily be made higher than the net p-type dopant concentration near the pn junction to improve electron injection efficiency. This improves the overall efficiency of the npn transistor. Further, by enabling the use of a more lightly doped n-type emitter, the device can have a higher maximum turn off voltage and a higher breakover voltage.

The top n+ layer 18 is then formed by a masked implant of arsenic or phosphorus at an energy of 10-150 keV and an area dose of $5\times10^{13}$ to $10^{16}$ cm$^{-2}$, to create a dopant concentration exceeding $10^{19}$ cm$^{-3}$. In one embodiment, the n+ layer 18 has a depth of 0.05-1.0 microns. This n+ layer 18 is for creating good ohmic contact with the cathode metal and lower contact resistance. It is desirable that the n+ layer be very highly doped and thin for high efficiency. By the upper p-well 36 portion being lightly doped, it is easier to provide the optimal doping of the thin n+ layer 18.

As a result of the improved efficiency and lower contact resistance, the threshold voltage is lowered, such as below one volts, and the npn transistor is more efficient.

Further, if the width of the p-type base of the npn transistor is increased, the npn transistor's off-state beta is reduced, which also increases breakover voltage. Ideally, the breakover voltage is designed to be equal to the breakdown voltage. The required width (e.g., for selecting breakdown voltage and beta) depends on the doping concentration and thickness of the p+ portion 37. When a threshold voltage is applied to the gate 26, the inversion of the p-type base around the gate 26 effectively bypasses the p+ portion 37 by extending the npn transistor emitter to below the gate 26, so the p+ portion 37 only lowers the beta of the npn transistor when there is no inversion of the base. The more lightly doped lower p-well 36 portion is also more easily converted by the gate. The gate depth can be controlled to extend any length into the p-well 36, so the width of the p-type base in the off-state may be adjusted independently of the effective width of the base (after the inversion) in the on-state.

By only increasing the dopant concentration of the p-type base in the middle of the p-type base and allowing the upper and lower p-well 36 portions to be more lightly doped, compared to the prior art, there is independent control over the characteristics of the n-type layer (emitter), the emitter-base junction characteristics, and the overall width and dopant concentration in the p-type base. This condition allows the variations of the depths and dopant concentrations of the various layers to obtain the benefits described herein.

Figure 3:
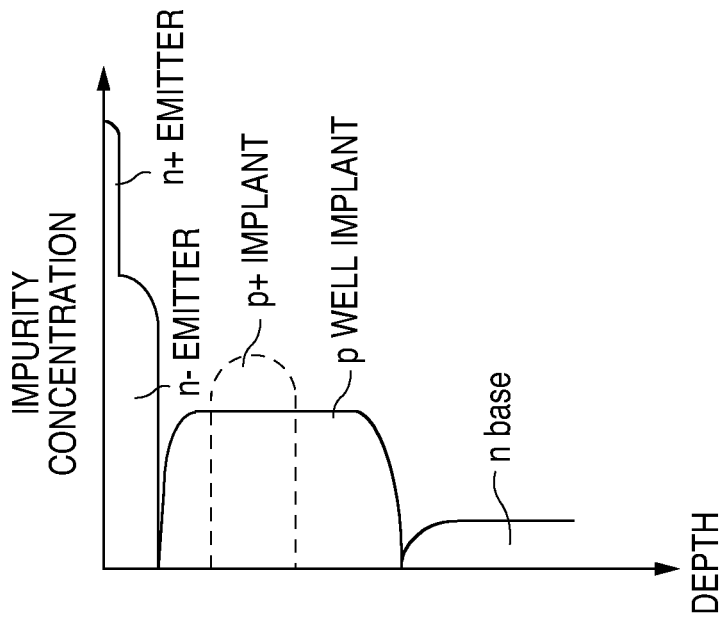
FIG. 3 illustrates a vertical doping profile of the structure of FIG. 2 from the top of the silicon to the n-type base.

A high breakdown voltage of the device can be achieved since the p+ portion 37 does not deplete as much as the more lightly doped portions of the p-well 36 when the device is in its off state. So the dopant concentration of the upper and lower p-well portions can be reduced (compared with the prior art device) without lowering the breakdown voltage. The relative dopant concentrations are illustrated in FIG. 3, where the depth is along the y axis and the concentration is along the x axis.

Trenches are then etched in the active areas. In one embodiment, the trenches can be, for example, 1-10 microns deep, but the minimum lateral trench widths are constrained by lithographic and etching limitations. Trench widths less than about 1 micron are preferred. The trenches are deeper than the p+ portion 37 and terminate in the lower p-well 36 portion.

After the trenches are etched, gate oxide 25 is grown on the sidewalls and bottoms of the trenches to, for example, 0.05-0.15 microns thick. Conductive material, such as heavily doped polysilicon or undoped polysilicon that is subsequently doped, fills the trenches and is planarized to form the gates 26 in all the cells.

A patterned dielectric 40 overlies the gates 26. There may be multiple openings over each n+ layer 18 portion for distributing current.

Various metal layers are then deposited to form the gate electrodes, the cathode electrode 22, and the anode electrode 20. The p+ substrate 12 may be thinned.

Other fabrication techniques may be used.

The thyristors in any of the figures may have the anode and cathode reversed by reversing the polarities of the materials.

Figure 4:
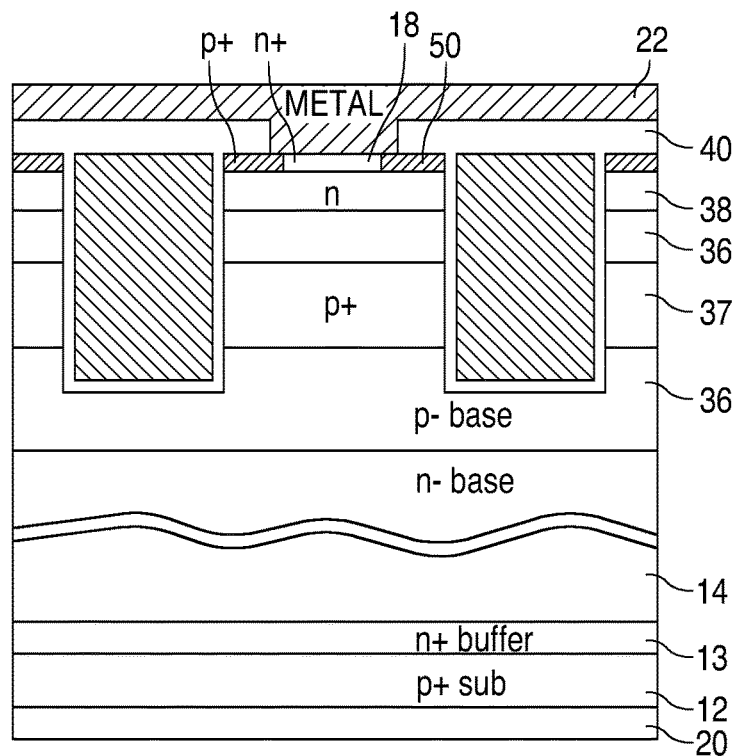
FIG. 4 illustrates an alternative embodiment with an additional p+ top layer adjacent the top n+ layer, used to form a p-channel MOSFET for turning off the thyristor by shorting the base of the npn transistor to its emitter.

FIG. 4 illustrates an optional additional p+ region 50 abutting the n+ layer 18 and being also connected to the cathode electrode 22. The p+ region 50, the underlying n-type layer 38, and the underlying p-well 36 form a vertical p− channel MOSFET. When the gate 26 is made negative with respect to the cathode electrode 22, a conductive channel is formed in the n-type layer 38 to effectively short the emitter of the npn transistor to its base (p-well 36) to quickly turn off the npn transistor to stop current flow through the device. By using the novel p-type base profile with the middle p+ portion 37, the n-type layer 38 (acting as a channel region for the p-channel MOSFET) can be more lightly doped to lower the threshold voltage of the p-channel MOSFET.

Figure 5:
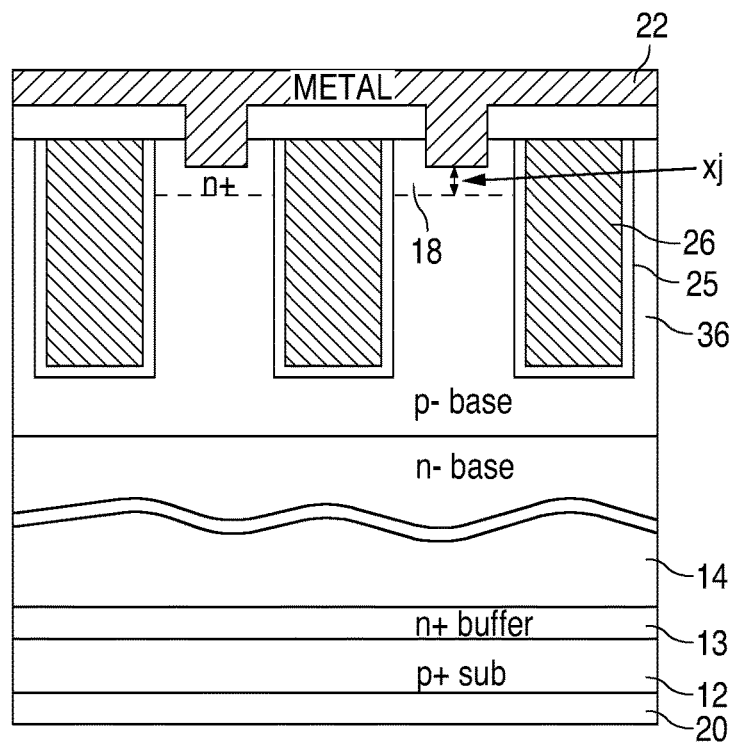
FIG. 5 is a cross-sectional view of an improved IGTO thyristor where the silicon is etched in the top n+ layer (emitter contact), and the cathode metal extends into the n+ layer to improve ohmic contact and reduce the forward voltage Vf. This technique can be combined with the technique of FIG. 2 or 4.

FIG. 5 illustrates a way to form a thin n+ emitter contact for the npn transistor to improve its efficiency to achieve a lower threshold voltage. After the formation of the n+ layer 18, the silicon is masked and etched, using RIE, to form a trench in the n+ layer 18 so that the distance xj between the bottom of the trench and the bottom of the n+ layer 18 is between about 0.2-0.5 microns. An additional n− dopant implant may then be performed to increase the concentration at the bottom of the trench. The trench is then filled with the cathode electrode metal. The additional implant improves ohmic contact between the metal and the n+ layer 18 (reducing contact resistance) to thereby further reduce the threshold voltage. The trench depth can be accurately controlled.

This technique of effectively thinning the n+ layer 18 and increasing its dopant concentration to improve the efficiency of the npn transistor is an improvement over just changing the n-type dopant implant depth to create the distance xj. One reason for this result is that the concentration of the n-type dopants in the small thickness xj can be made very high by the etching followed by an additional shallow implant. If n-type dopants were simply implanted into unetched silicon within a narrow depth range, diffusion would reduce the concentration and deepen the emitter.

Figure 6:
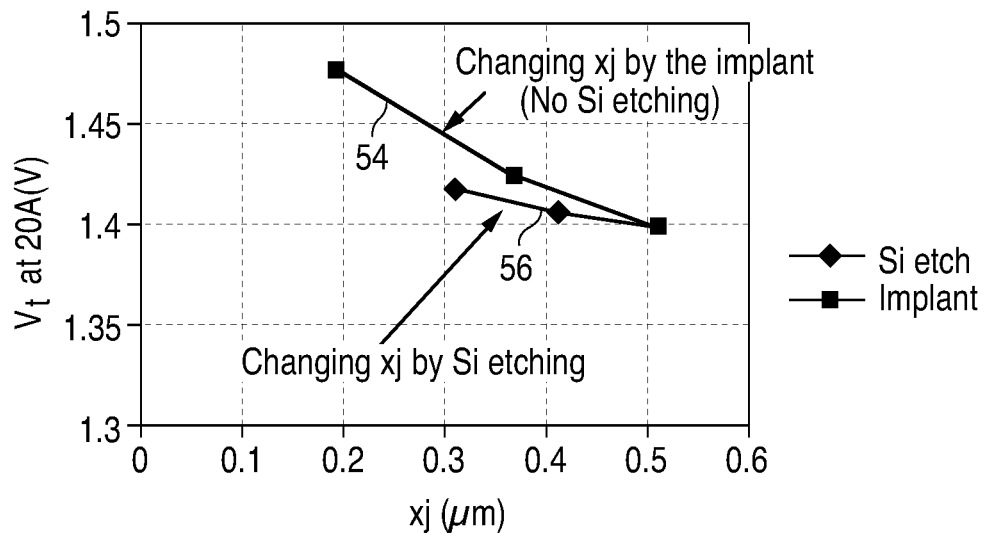
FIG. 6 illustrates simulation results from the structure of FIG. 5, showing the improved reduction in forward voltage vs. simply implanting the n emitter dopants at a shallower depth.

FIG. 6 illustrates simulation results performed on the device of FIG. 5, showing the effects of the thinned n+ layer 18, having a thickness xj, on the threshold voltage Vt. The current through the device is 20A. The line 54 illustrates the effect of n+ layer 18 thickness on threshold voltage Vt when the thickness is solely determined by the implant process. The line 56 illustrates the effect of n+ layer 18 thickness on threshold voltage Vt when the thickness is determine by the silicon etching and subsequent implant into the trench. As seen, the threshold voltage is lower when using the etch technique.

Figure 7:
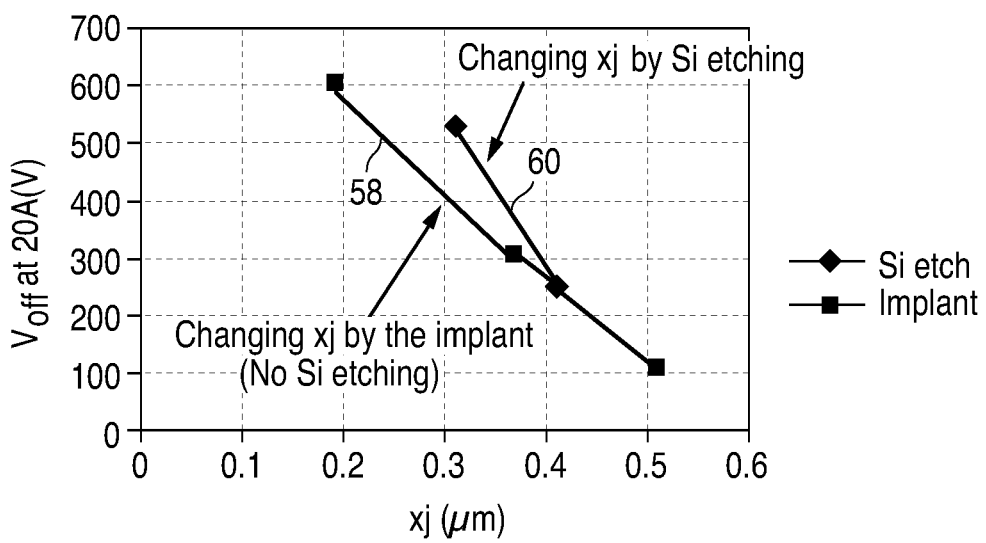
FIG. 7 illustrates simulation results from the structure of FIG. 5 showing the improved maximum turn off voltage vs. simply implanting the n emitter dopants at a shallower depth.

The etch technique to form the thinner n+ emitter also results in a higher maximum turn-off voltage (referred to as off voltage Voff), where the maximum turn off voltage is that anode-cathode voltage, at 20A, over which the device cannot be turned off by the gate. This behavior is shown by the simulation of FIG. 7, where the maximum off voltage Voff is along the y axis and the thickness of the n+ layer 18 is along the x axis. The line 58 illustrates the effect of n+ layer 18 thickness on off voltage Voff when the thickness is solely determined by the implant process. The line 60 illustrates the effect of n+ layer 18 thickness on off voltage Voff when the thickness is determine by the silicon etching. The subsequent n+ implant into the trench may also be used to reduce contact resistance and thus reduce the threshold voltage Vt, as explained above.

Other simulation results have shown the improvement in the threshold voltage Vt with no significant adverse effect on breakover voltage or switching loss.

The techniques of FIG. 2 and FIG. 5 can be used independently or in conjunction to reduce the gate threshold voltage and increase the breakover voltage, without decreasing the maximum turn off voltage. Thus, SOA is not adversely affected.

Figure 8:
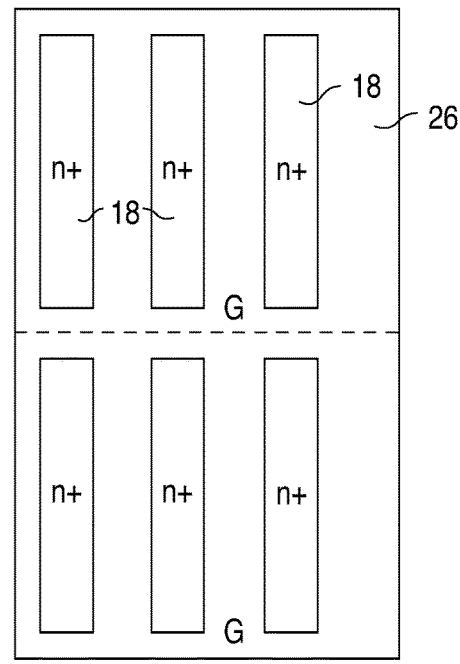
FIG. 8 is a simplified top down view of an array or matrix of cells in the IGTO thyristor where FIG. 2, 4, or 5 cuts across two or three of the cells.

FIG. 8 is a top down view of a small portion of an array or matrix of cells in the IGTO thyristor, where FIGS. 2 and 5 are cross-sections across a few cells. The n+ layer 18 areas are shown surrounded by the gates 26. Other configurations are envisioned.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A device comprising:
a first semiconductor layer of a first conductivity type;
a second semiconductor layer of a second conductivity type over the first semiconductor layer;
a third semiconductor layer of the first conductivity type over the second semiconductor layer, wherein the third semiconductor layer comprises a lower portion, an intermediate portion, and an upper portion, where in the intermediate portion has a dopant concentration at least 1.5 that the dopant concentration of the lower portion and upper portion;
a matrix of cells comprising a plurality of insulated gate regions within trenches formed within the third semiconductor layer but not extending to the second semiconductor layer, the trenches terminating in the lower portion of the third semiconductor layer; and
a fourth semiconductor layer of the second conductivity type over the third semiconductor layer, the fourth semiconductor layer being formed in first areas between at least some of the gate regions, wherein a vertical structure of npn and pnp transistors is formed, and conduction between the first semiconductor layer and the fourth semiconductor layer is controlled by a voltage applied to the gate regions,
wherein the gate regions are configured to form an inversion layer in the third semiconductor layer, when a certain potential is applied to the gate regions, to cause carriers to flow into a base of one of the npn transistor or the pnp transistor to cause current to flow vertically through the device.

2. The device of claim 1 wherein the first conductivity type is a p-type and the second conductivity type is an n-type.

3. The device of claim 1 wherein the first conductivity type is an n-type and the second conductivity type is a p-type.

4. The device of claim 1 wherein the first semiconductor layer is a substrate.

5. The device of claim 1 wherein the third semiconductor layer is a well.

6. The device of claim 1 wherein the first semiconductor layer acts as an emitter for the pnp transistor, the second semiconductor layer acts as a base for the pnp transistor and a collector for the npn transistor, the third semiconductor layer acts as a base for the npn transistor and a collector for the pnp transistor, and the fourth semiconductor layer acts as an emitter for the npn transistor.

7. The device of claim 1 further comprising:
a trench formed in the fourth semiconductor layer; and
a conductor filling the trench formed in the fourth semiconductor layer, wherein the trench and conductor effectively reduce a thickness of the fourth semiconductor layer over the third semiconductor layer.

8. The device of claim 7 wherein a bottom of the trench in the fourth semiconductor layer is additionally doped with dopants of the second conductivity type.

9. The device of claim 1 further comprising a fifth semiconductor layer of the second conductivity type formed in a top surface of the fourth semiconductor layer acting as an emitter contact region, wherein the fifth semiconductor layer is more highly doped than the fourth semiconductor layer.

10. The device of claim 1 wherein the intermediate portion has a dopant concentration at least ten times the dopant concentration of the lower portion and upper portion.

11. The device of claim 1 further comprising:
a fifth semiconductor layer of the first conductivity type, adjacent at least one of the insulated gate regions, formed in the fourth semiconductor layer of the second conductivity type,
the fifth semiconductor layer, along with the fourth semiconductor layer and the third semiconductor layer forming a vertical MOSFET, wherein a turn-off bias voltage on the insulated gate regions creates a conductive channel in the fourth semiconductor layer between the fifth semiconductor layer and the third semiconductor layer to turn off the device.

12. The device of claim 1 wherein a net doping in the fourth semiconductor layer of the second conductivity type is greater than a net doping in the third semiconductor layer of the first conductivity type at a junction of the fourth semiconductor layer and the third semiconductor layer.

13. The device of claim 1 wherein the third semiconductor layer of the first conductivity type contains dopants of the first conductivity type implanted in a first implantation step and driven-in, followed by a second implantation of dopants of the first conductivity type to form the intermediate portion.

14. The device of claim 1 wherein the gate regions are configured to form the inversion layer in the third semiconductor layer, when the certain potential is applied to the gate regions, to reduce an effective base width of one of the npn transistor or the pnp transistor to increase its beta to initiate regenerative thyristor action.

15. The device of claim 1 wherein the device is an insulated gate turn-off thyristor.

* * * * *